Aug. 24, 1965 N. DE WOLF 3,202,832

CONTROLLABLE SEMICONDUCTOR DEVICE

Filed June 17, 1960

*INVENTOR.*

NICHOLAS DEWOLF

*BY* Ezekiel Wolf, Wolf + Greenfield

ATTORNEYS 3,202,832

CONTROLLABLE SEMICONDUCTOR DEVICE

Nicholas De Wolf, Boston, Mass., assignor to Transitron Electronic Corporation, Wakefield, Mass., a corporation of Delaware Filed June 17, 1960, Ser. No. 36,769
4 Claims. (Cl. 307—88.5)

The present invention relates in general to semiconductor devices and more particularly concerns a novel controllable semiconductor device having a negative resistance characteristic which may be controlled by signals applied to one or more control electrodes so that the device may assume a selected one of two stable states. The device itself provides gain so that low level control signals may be used to switch the device from either state to the other. The invention may selectively apply or interrupt current to an external load, rapidly responding to low level control signals when changing to either state. A single device according to the invention performs the functions of flip-flops and similar devices which require a number of costly amplifying devices.

A typical prior art bistable semiconductor device comprises a four-layer diode having four layers of alternate conductivity defining three intermediate rectifying junctions, the current delivered to an external load being transmitted across all three junctions. Applying a small control signal current to one of the intermediate layers initiates conduction and delivery of a larger load current. However, nearly the entire load current must be withdrawn from the intermediate layer to cut the device off. Thus, these devices usually have turn on gain without turn off gain. While some devices have been developed which do have turn off gain, their characteristics are often a function of the environmental temperature and cannot be used in many applications requiring stability over a wide temperature range. In addition, such devices are very difficult to manufacture with consistently reproduceable characteristics.

It is an important object of the present invention to provide a semiconductor device responsive to low level signals for both turning on and turning off a much larger load current.

It is still another object of the invention to provide a semiconductor device in accordance with the preceding object which retains a selected stable state despite wide variations in environmental conditions, such as temperature.

It is another object of the invention to provide a semiconductor device in accordance with the preceding objects which is relatively easy to fabricate and may be produced in large quantities with reproduceable characteristics.

According to the invention, the novel semiconductor device comprises a plurality of contiguous semiconductor regions, adjacent regions being of opposite conductivity to define a first plurality of rectifying junctions which separate adjacent regions. A second lesser plurality of the said rectifying junctions is characterized by a negative resistance characteristic where the current decreases from a peak value to cut-off value while the potential increases over a small range. A potential applied across at least another of said junctions selectively controls said current.

Numerous other features, objects and advantages of the invention will become apparent from the following specification when read in connection with the accompanying drawing in which.

Figure 1:
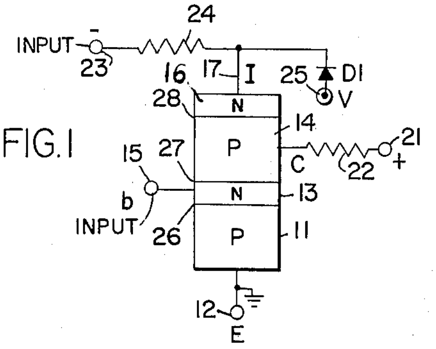
FIG. 1 is a schematic representation of the semiconductor device together with a few external circuit components arranged in a simple circuit advantageously employing the features of the novel semiconductor device.

With reference now to the drawing and more particularly FIG. 1 thereof, there is shown a schematic representation of a device according to the invention in association with two external resistors and a diode in a circuit which advantageously employs the bistable properties of the device. The novel device will hereafter be referred to as a binistor. As an aid in understanding the principles of the invention, certain electrodes and semiconducting regions of the novel device will be referred to as collector, emitter and base because the functions of these regions and electrodes is analogous to similarly labelled regions and electrodes of a conventional transistor. A fourth electrode and region will be referred to as an injector. The injector, although isolated from the base region by the collector region, functions to controllably inject carriers into the base region so that collector current is a function of the sum of base current and injector current when the junction between injector and collector regions is forward biased. The mode of operation is described in detail below.

The device represented in FIG. 1 comprises four layers of semiconductor material. The lower layer 11 is referred to as the emitter layer and the attached electrode 12 is the emitter lead. The N-type base layer 13 is usually thin. The attached electrode 15 is referred to as the base lead. The P-type collector layer 14 is also thin.

The N-type top layer 16 of the binistor is the injector layer and the attached electrode 17 is referred to as the injector lead. The letters I, C, B and E identify the injector, collector, base and emitter throughout the drawings.

The collector is direct-coupled to a source of positive potential on terminal 21 by a load resistor 22. The injector 17 is direct-coupled to control signal input terminal 23 by a resistor 24. A clamping diode $D_1$ couples injector lead 17 to a source of clamping potential applied on terminal 25.

The different layers of semiconductor material define three rectifying junctions 26, 27 and 28.

If layers 11, 13 and 14 are regarded as forming a conventional PNP transistor having a beta of $B_1$, the collector current delivered to load 22 is $B_1$ times the base current flowing in base region 13. It has been discovered that this base current will be functionally related to the injector current delivered to injector electrode 17. In effect, regions 13, 14 and 16 function as an NPN transistor with the region 13 functioning as the collector of the latter transistor portion. If this transistor portion has a current gain or alpha of $a_2$, the current which flows across junction 27 due to injector current entering injector electrode 17 is $a_2 i_j$. With base terminal 15 open circuited as shown, the latter current also flows across junction 26 and has the same effect as base current flowing through base lead 15.

Region 14 is then functioning as the base of the NPN transistor portion and the collector of the PNP portion so that the current flowing through resistor 22 is the algebraic sum of the NPN base portion current and the PNP collector portion current.

The NPN portion base current is $(1-a_2)i_j$; that is, that portion of the injector current which does not cross junction 27. The collector current of the PNP portion is $a_2 i_j B_1$; that is, the beta of that transistor portion times its base current.

Figure 2:
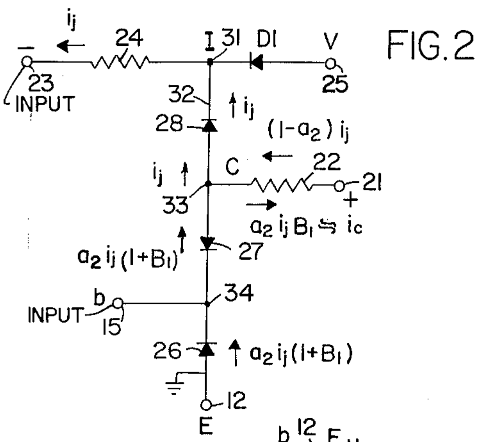
FIG. 2 illustrates a schematic representation of the device of FIG. 1 in association with the external components.

Referring to FIG. 2, there is illustrated an equivalent circuit representation of the novel semiconductor device with the different junctions represented as appropriately poled diodes together with associated circuit components shown in FIG. 1. The application of Kirchoff's law relating to currents, that is, the algebraic summation of currents at a node is zero, is helpful in analyzing the mode of operation. It is convenient to assume that the novel device is initially conductive. Clamping diode D1 is then nonconductive and the injector current $i_j$ enters node 31 from branch 32 and leaves that node through resistor 24. Diode junction 28 is then biased in the forward direction and a current $i_j$ flows across diode junction 28 from the collector node 33.

The current $i_j$ is withdrawn from the collector node 33 through diode junction 28 and the current $a_2B_1i_j$ withdrawn through load resistance 22 is lower PNP transistor portion $a_2B_1i_j$ diminished by the effective base current $(1-a_2)i_j$ of the upper NPN transistor portion delivered to the collector node 33. The current delivered to the collector node 33 from the branch including diode junction 27 is $a_2i_j(1+B_1)$ and this same current flows into base node 34 across diode junction 26 in the absence of the flow of base current through base electrode 15.

Before further discussing the characteristics of the novel device, it is helpful to understand the nature of the biasing potentials across the different junctions to establish conduction and create the current relationships just described. Diode junctions 26 and 28 are then forward biased while diode junction 27 is normally reverse-biased but is often forward biased when full saturation is permitted and clamping diode $D_1$ is reverse-biased. The potential on ejector node 31 is approximately at collector potential because diode junction 28 presents a low impedance. Injector node 31 is slightly negative with respect to collector node 33 to maintain diode junction 28 conductive. Diode junction 27 is reverse-biased and with a sufficiently low resistance for load resistance 22, a collector current peak is rapidly reached and is substantially equal to $a_2i_jB_1$.

Figure 3:
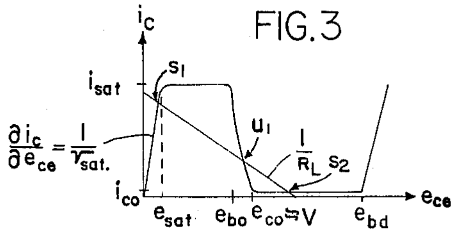
FIG. 3 is a graphical representation of the characteristics of the novel device.

Referring to FIG. 3, the collector current $i_c$ as a function of the potential on collector node 33 referenced to emitter electrode 12 is graphically represented. Note that peak current $i_{sat.}$ is rapidly reached at a very small magnitude of collector potential, designated $e_{sat.}$. For the region between the saturation voltage $e_{sat.}$ and the break off voltage $e_{bo}$, increasing the magnitude of the negative potential on collector node 33 causes virtually no change in the current delivered by the collector.

The portion of the characteristic just described is typical of conventional transistor behavior. When the collector node 33 is caused to go still further negative beyond a fixed injector potential, diode junction 28 is rendered nonconductive for a relatively small additional change in the collector node potential. Thus the break off potential is determined by the injector supply potential. This change toward nonconduction causes a reduction in the flow of injector current $i_j$. Since the collector current $i_c$ is a function of the injector current $i_j$, the latter current immediately decreases until at the potential $e_{co}$, diode junction 28 is then essentially fully reverse-biased and nonconductive so that both the injector current $i_j$ and the functionally related collector current $i_c$ become essentially zero as indicated in FIG. 3. Devices according to the invention thus exhibit a negative resistance characteristic.

Diode junction 28 may also be rendered nonconductive by making the potential on injector node 31 sufficiently more positive than the potential on collector node 33. This can be accomplished by making the voltage V on terminal 25 more positive than the emitter potential. Alternatively, the voltage on terminal 23 may be made less negative, thus decreasing the injector supply current. Once the binistor is cut off, collector node 33 assumes essentially the potential on terminal 21. Conduction will not resume until base current is transmitted through base lead 15 or injector lead 17 is made sufficiently negative to again render diode junction 28 conductive.

It should be noted that the device is characterized by gain during switching by controlling the current flow in either the injector or the base leads. This will be better understood when it is recognized that the alpha $a_2$ of the upper transistor portion is a fraction near unity while the beta $B_1$ of the lower transistor portion is a factor much larger than unity. Thus, changes in base lead current cause corresponding changes in collector current multiplied in magnitude by the latter factor. And changes in injector lead current cause about the same changes caused by base lead current variations, but reduced by the fraction near unity equal to the upper transistor portion alpha, $a_2$.

If the collector potential increases further until it exceeds the breakdown potential, $e_{bd}$, avalanching or Zener breakdown occurs and the collector current again increases as a function of collector voltage.

For stable operation of the device, the operating potential on terminal 21 should be selected preferably in the region between the injector supply potential and the breakdown potential $e_{bd}$. In addition, the value of resistance 22 should be selected so that the load line $1/R_L$ extends from the operating potential of terminal 21 on the horizontal axis to a point on the vertical axis below the value of peak current $i_{sat.}$. The device will then have a stable conducting state with stable operating points at $S_1$ and $S_2$. The operating point at $U_1$ lies on the negative resistance portion of the device characteristic. This operating point is unstable.

The novel device has a number of advantages. It may be switched from one stable state to the other by applying a low level control signal of appropriate polarity, either to the injector electrode 23 or the base electrode 15. The collector current, with the device nearly cutoff, may be made equal to the leakage of junction 21 without amplification. Such a low value of cutoff current minimizes power dissipation, minimizes the effects of temperature variations and improves reliability. An important feature of the invention resides in the amplification provided by the lower transistor portion when the stable state is being changed in either direction by controlling either or both base and injector lead currents.

Having described the principles of the invention, it is appropriate to consider some specific device structures which embody the inventive concepts. Sectional views of the devices are shown. For clarity, only conducting portions are cross-hatched. By not cross-hatching the semiconducting portions, they are more easily distinguished from metallic portions and the sybmol P or N identifying the conductivity type of the regions is more easily recognized. The same reference numerals employed in the schematice representations in FIGS. 1 and 2 are used in FIGS. 4–8 to identify corresponding regions and leads.

Figure 4:
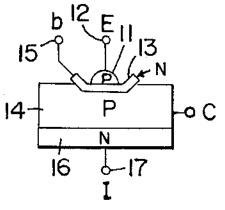
FIGS. 4–8 show sectional views through different embodiments of devices according to the invention.

Referring to FIG. 4, there is shown one type of device in which the emitter region 11 and base region 13 could be fabricated by the well-known double diffusion process. The injector region 16 could be formed by a single diffusion process. Connections from the terminals to the different regions are diagramatically represented.

Figure 5:
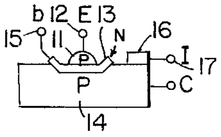

FIG. 5 shows a structure similar to that of FIG. 4 with the exception that the injector region 16 is on the same side of the collector region 14 as the emitter region 11 and base region 13.

Figure 6:
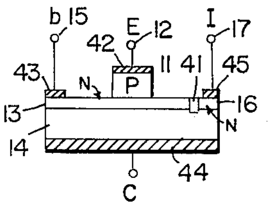

FIG. 6 shows still another device according to the invention wherein a conventional transistor is converted into a binistor by cutting through the base region to form a groove 41 which isolates the base region 13 from the injector region 16. Metallic layers 42, 43, 44 and 45 establish conductive contact with the regions 11, 13, 14 and 16, respectively.

Figure 7:
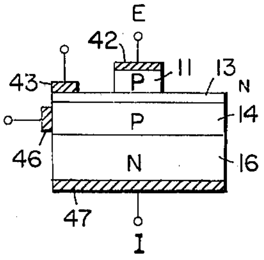

Referring to FIG. 7, there is shown a binistor formed by diffusing the injector layer 16 into a block of semiconducting material which forms mostly the collector region 14. A layer of metal 46 establishes conductive contact with the side of the collector region 14 and a layer of metal 47 establishes conductive contact with the injector region 16.

Figure 8:
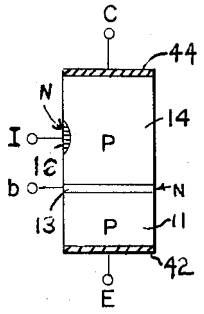

Referring to FIG. 8, there is shown still another binistor in which a conventional bar transistor is converted into a binistor by bonding an N-type carrier metal into the collector region 14.

The specific forms of devices described herein are by way of example only. For example, the binistor may be an NPNP device instead of the PNPN device described herein. In fact, devices of the former type which exhibit excellent operating characteristics have actually been constructed.

It is evident that those skilled in the art can now make numerous modifications of, departures from and uses of the novel devices described herein without departing from the inventive concepts. Consequently, the invention is to be construed as limited only by the spirit and scope of the appended claims.

What is claimed is:

1. A semiconductor device comprising,
four contiguous semiconductor regions,
adjacent regions being of opposite conductivity to define three rectifying junctions,
an emitter lead and an injector lead connected to respective extreme ones of said regions functioning as an emitter and as an injector respectively,
a collector lead connected to the intermediate region functioning as a collector which intermediate region separates the injector from the other intermediate region,
said regions being arranged so that a potential applied between said emitter and collector leads establishes a field for biasing the rectifying junction between said intermediate regions,
means including said injector lead and the extreme region to which it is connected for establishing a conduction path for carriers for establishing a negative resistance characteristic between said emitter and collector leads in which an increase in potential therebetween is accompanied by a decrease in current flowing through said collector lead for a prescribed potential range above a breakover potential and for establishing a positive resistance characteristic between said emitter and collector leads in which an increase in potential therebetween is accompanied by an increase in current flowing through said collector lead below a saturation current potential lower than said breakover potential which saturation potential corresponds to the lowest potential where maximum collector current is attained when the only potential changed is that between said emitter and collector leads,
a source of a fixed biasing potential,
means for direct coupling said fixed biasing potential between said emitter lead and said collector lead to normally reverse bias the base-collector rectifying junction,
a source of injector biasing potential,
means for applying said injector biasing potential to said injector lead to establish said breakover potential and reverse bias the injector-collector rectifying junction when said device is in the nonconducting state providing nearly zero current in said collector lead and forward bias the injector-collector rectifying junction when said device conducts sufficiently to draw enough current through said collector lead to establish the potential on said collector lead to a value less than that on said injector lead,
whereby a potential applied between said collector and emitter leads causes a decrease in the current delivered by said collector electrode as said potential increases for a predetermined limited potential range related to the potential on said injector, the magnitude of the collector current delivered by said device being a function of the current in said injector.

2. A semiconductor device in accordance with claim 1 and further comprising,
a base lead connected to the intermediate region functioning as a base which intermediate region is nearest the emitter,
whereby the magnitude of the collector current delivered by said device is both a function of the current in said injector and the current in said base.

3. A semiconductor device in accordance with claim 2 and further comprising,
a load in series with said emitter lead, collector lead and said source of fixed biasing potential,
and means for introducing and withdrawing currrent in said base lead.

4. A semiconductor device in accordance with claim 3 and further comprising,
a source of a fixed limit potential,
and means for clamping said injector lead to said fixed limit potential.

References Cited by the Examiner

UNITED STATES PATENTS

| | | | |
|---|---|---|---|
| 2,655,610 | 10/53 | Ebers | 307—88.5 |
| 2,754,431 | 7/56 | Johnson | 307—88.5 |
| 2,779,877 | 1/57 | Lehavec | 307—88.5 |
| 2,801,347 | 7/57 | Dodge. | |
| 2,801,348 | 7/57 | Pankove | 307—88.5 |
| 2,877,359 | 3/59 | Ross | 307—88.5 |
| 2,921,205 | 1/60 | Giacoletto | 307—88.5 |
| 3,065,360 | 11/62 | Vallese | 307—88.5 |
| 3,124,703 | 3/64 | Sylvan | 307—88.5 |

OTHER REFERENCES

Pub. I: Hurley, "Junction Transistor Electronics," John Wiley & Sons, Inc., New York, 1958.

JOHN W. HUCKERT, *Primary Examiner.*

GEORGE N. WESTBY, *Examiner.*